US008859933B2

(12) United States Patent
Harley et al.

(10) Patent No.: US 8,859,933 B2
(45) Date of Patent: Oct. 14, 2014

(54) HIGH THROUGHPUT SOLAR CELL ABLATION SYSTEM

(75) Inventors: Gabriel Harley, Mountain View, CA (US); Thomas Pass, San Jose, CA (US); Peter John Cousins, Menlo Park, CA (US); John Viatella, San Mateo, CA (US)

(73) Assignee: SunPower Corporation, San Jose, CA (US)

( * ) Notice: Subject to any disclaimer, the term of this patent is extended or adjusted under 35 U.S.C. 154(b) by 212 days.

(21) Appl. No.: 13/584,613

(22) Filed: Aug. 13, 2012

(65) Prior Publication Data

US 2012/0312791 A1    Dec. 13, 2012

Related U.S. Application Data

(62) Division of application No. 12/829,275, filed on Jul. 1, 2010, now Pat. No. 8,263,899.

(51) Int. Cl.
| | | |
|---|---|---|
| *B23K 26/38* | (2014.01) | |
| *H01L 31/20* | (2006.01) | |
| *H01L 31/0216* | (2014.01) | |
| *H01L 31/0224* | (2006.01) | |
| *H01L 31/068* | (2012.01) | |
| *B23K 26/08* | (2014.01) | |

(52) U.S. Cl.
CPC ............ *H01L 31/202* (2013.01); *B23K 26/0807* (2013.01); *H01L 31/02168* (2013.01); *H01L 31/022441* (2013.01); *H01L 31/0682* (2013.01); *Y02E 10/547* (2013.01); *Y02E 10/52* (2013.01)
USPC ............. 219/121.67; 219/121.68; 219/121.69

(58) Field of Classification Search
CPC ............ H01L 31/202; H01L 31/02168; H01L 31/022441; H01L 31/0682; Y02E 10/547; Y02E 10/52; B23K 26/0807
USPC ................................................ 219/121.67–69
See application file for complete search history.

(56) References Cited

U.S. PATENT DOCUMENTS

| 4,322,571 A | 3/1982 | Stanberry |
| 4,626,613 A | 12/1986 | Wenham et al. |

(Continued)

FOREIGN PATENT DOCUMENTS

| JP | 2008-283023 | 11/2008 |
| JP | 2009-071221 | 4/2009 |

OTHER PUBLICATIONS

Unitek Miyachi Lasers Connections, "Understanding Laser Parameters for Weld Development" Technical Application Brief, 2003, 2 sheets, vol. 1/No. 3.

(Continued)

*Primary Examiner* — Laura Menz
(74) *Attorney, Agent, or Firm* — Okamoto & Benedicto LLP (57) ABSTRACT

A solar cell is formed using a solar cell ablation system. The ablation system includes a single laser source and several laser scanners. The laser scanners include a master laser scanner, with the rest of the laser scanners being slaved to the master laser scanner. A laser beam from the laser source is split into several laser beams, with the laser beams being scanned onto corresponding wafers using the laser scanners in accordance with one or more patterns. The laser beams may be scanned on the wafers using the same or different power levels of the laser source.

7 Claims, 11 Drawing Sheets

(56) References Cited

U.S. PATENT DOCUMENTS

| | | | |
|---|---|---|---|
| 5,011,565 A | 4/1991 | Dube et al. | |
| 5,183,780 A | 2/1993 | Noguchi et al. | |
| 5,258,077 A | 11/1993 | Shahryar | |
| 5,432,015 A | 7/1995 | Wu et al. | |
| 5,456,763 A | 10/1995 | Kaschmitter et al. | |
| 5,738,731 A | 4/1998 | Shindo et al. | |
| 5,821,590 A | 10/1998 | Lee et al. | |
| 6,172,297 B1 | 1/2001 | Hezel et al. | |
| 6,982,218 B2 | 1/2006 | Preu et al. | |
| 7,732,104 B2 | 6/2010 | Wagner | |
| 7,732,264 B2 | 6/2010 | Shih | |
| 7,759,607 B2 | 7/2010 | Chism, II | |
| 7,777,154 B2 | 8/2010 | Satoh et al. | |
| 7,781,766 B2 | 8/2010 | Shih et al. | |
| 7,799,659 B2 | 9/2010 | Pressel et al. | |
| 7,834,293 B2 * | 11/2010 | Wile et al. | 219/121.69 |
| 7,989,729 B1 * | 8/2011 | Zhao et al. | 219/121.76 |
| 8,129,822 B2 | 3/2012 | Moslehi | |
| 8,258,426 B2 * | 9/2012 | Zhang et al. | 219/121.67 |
| 8,263,899 B2 * | 9/2012 | Harley et al. | 219/121.67 |
| 8,536,483 B2 * | 9/2013 | Thomas et al. | 219/121.68 |
| 2006/0060238 A1 | 3/2006 | Hacke et al. | |
| 2006/0196535 A1 | 9/2006 | Swanson et al. | |
| 2007/0137692 A1 | 6/2007 | Carlson | |
| 2007/0199927 A1 | 8/2007 | Gu et al. | |
| 2008/0035198 A1 | 2/2008 | Teppe et al. | |
| 2008/0116182 A1 * | 5/2008 | Curry | 219/121.75 |
| 2008/0157283 A1 | 7/2008 | Moslehi | |
| 2008/0299297 A1 | 12/2008 | Cousins et al. | |
| 2009/0107545 A1 | 4/2009 | Moslehi | |
| 2009/0151784 A1 | 6/2009 | Luan et al. | |
| 2009/0188553 A1 | 7/2009 | Dubin | |
| 2009/0239331 A1 | 9/2009 | Xu et al. | |
| 2009/0308457 A1 | 12/2009 | Smith | |
| 2009/0314344 A1 | 12/2009 | Fork et al. | |
| 2010/0055901 A1 * | 3/2010 | Zhang et al. | 438/669 |
| 2010/0062560 A1 | 3/2010 | Farris, III et al. | |
| 2010/0252543 A1 * | 10/2010 | Manens et al. | 219/121.69 |
| 2010/0304522 A1 | 12/2010 | Rana et al. | |
| 2011/0300665 A1 | 12/2011 | Harley et al. | |
| 2012/0003788 A1 * | 1/2012 | Harley et al. | 438/98 |
| 2012/0028399 A1 | 2/2012 | Moslehi et al. | |
| 2012/0055546 A1 | 3/2012 | Turner | |
| 2012/0060908 A1 | 3/2012 | Crafts | |
| 2012/0312791 A1 * | 12/2012 | Harley et al. | 219/121.6 |

OTHER PUBLICATIONS

Overview: Lumera Laser Products, Jan. 2009, pp. 1-12.

Beam splitter from Wikipedia, the free encyclopedia, page modified Sep. 12, 2011, 2 sheets [retrieved on Dec. 5, 2011]. Retrieved from the internet: http://en.wikipedia.org/wiki/Beam_splitter.

Wave plate from Wikipedia, the free encyclopedia, page modified Nov. 21, 2011, 2 sheets [retrieved on Dec. 5, 2011]. Retrieved from the internet: http://en.wikipedia.org/wiki/Half_wave_plate.

Polarizer from Wikipedia, the free encyclopedia, page modified Oct. 18, 2011, 12 sheets [retrieved on Dec. 5, 2011]. Retrieved from the internet: http://en.wikipedia.org/wiki/Polarizer.

Annerose Knorz, et al. "Laser Ablation of Antireflection Coatings for Plated Contacts Yielding Solar Cell Efficiencies Above 20%", Sep. 21-25, 2009, 4 sheets, 24th European PV Solar Energy Conference and Exhibition, Hamburg, Germany.

E. Schneiderlochner, et al. "Lasser-Fired Rear Contacts for Crystalline Silicon Solar Cells", 2002, 6 sheets, Prog. Photovolt. Res. Appl. 2002; 10:29-34.

Peter Engelhart, et al. "Laser Ablation of SiO2 for Locally Contacted Si Solar Cells with Ultra-short Pulses", Mar. 27, 2007, 7 sheets, Prog. Photovolt. Res. Appl. 2007; 15:521-527.

R. Preu, et al. "Laser Ablation—A New Low-Cost Approach for Passivated Rear Contact Formation in Crystalline Silicon Solar Cell Technology", May 2002, 4 sheets, 16th European Photovoltaic Solar Energy Conference, Glasgow, UK.

Marc Hofmann, et al. "Industrial Type CZ Silicon Solar Cells with Screen-Printed Fine Line Front Contacts and Passivated Rear Contacted by Laser Firing", Sep. 1-5, 2008, 4 sheets, 23rd European Phovoltaic Solar Energy Conference and Exhibition, Valencia, Spain.

S. W. Glunz, et al. "New Simplified Methods for Patterning the Rear Contact of RP-PERC High-Efficiency Solar Cells", 2000, pp. 168-171, IEEE.

Sonja Hermann, et al. "Process Characterisation of Picosecond Laser Ablation of SIO2 and SINx Layers on Planar and Textured Surfaces", 2008, 5 sheets, Proceedings of the 23rd European Photovoltaic Solar Energy Conference, Germany.

* cited by examiner

HIGH THROUGHPUT SOLAR CELL ABLATION SYSTEM

CROSS-REFERENCE TO RELATED APPLICATION

This application is a divisional of U.S. application Ser. No. 12/829,275, filed on Jul. 1, 2010, which is incorporated herein by reference in its entirety.

STATEMENT REGARDING FEDERALLY SPONSORED RESEARCH OR DEVELOPMENT

This disclosure was made with Government support under Contract No. DEFC36-07GO17043 awarded by the United States Department of Energy.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The metal contact fingers allow an external electrical circuit to be coupled to and be powered by the solar cell.

To be competitive against other sources of energy, equipment cost and throughput are important considerations in the fabrication of solar cells. Embodiments of the invention pertain to a solar cell ablation system that allows for high throughput while minimizing the cost of the system.

SUMMARY

In one embodiment, a solar cell is formed using a solar cell ablation system. The ablation system includes a single laser source and several laser scanners. The laser scanners include a master laser scanner, with the rest of the laser scanners being slaved to the master laser scanner. A laser beam from the laser source is split into several laser beams, with the laser beams being scanned onto corresponding wafers using the laser scanners in accordance with one or more patterns. The laser beams may be scanned on the wafers using the same or different power levels of the laser source.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components. The drawings are not to scale.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention pertains to a high throughput and cost effective solar cell ablation system. Another solar cell ablation system is also disclosed in commonly-assigned U.S. patent application Ser. No. 12/795,526, filed on Jun. 7, 2010, entitled "ABLATION OF FILM STACKS IN SOLAR CELL FABRICATION PROCESSES."

Figure 1:
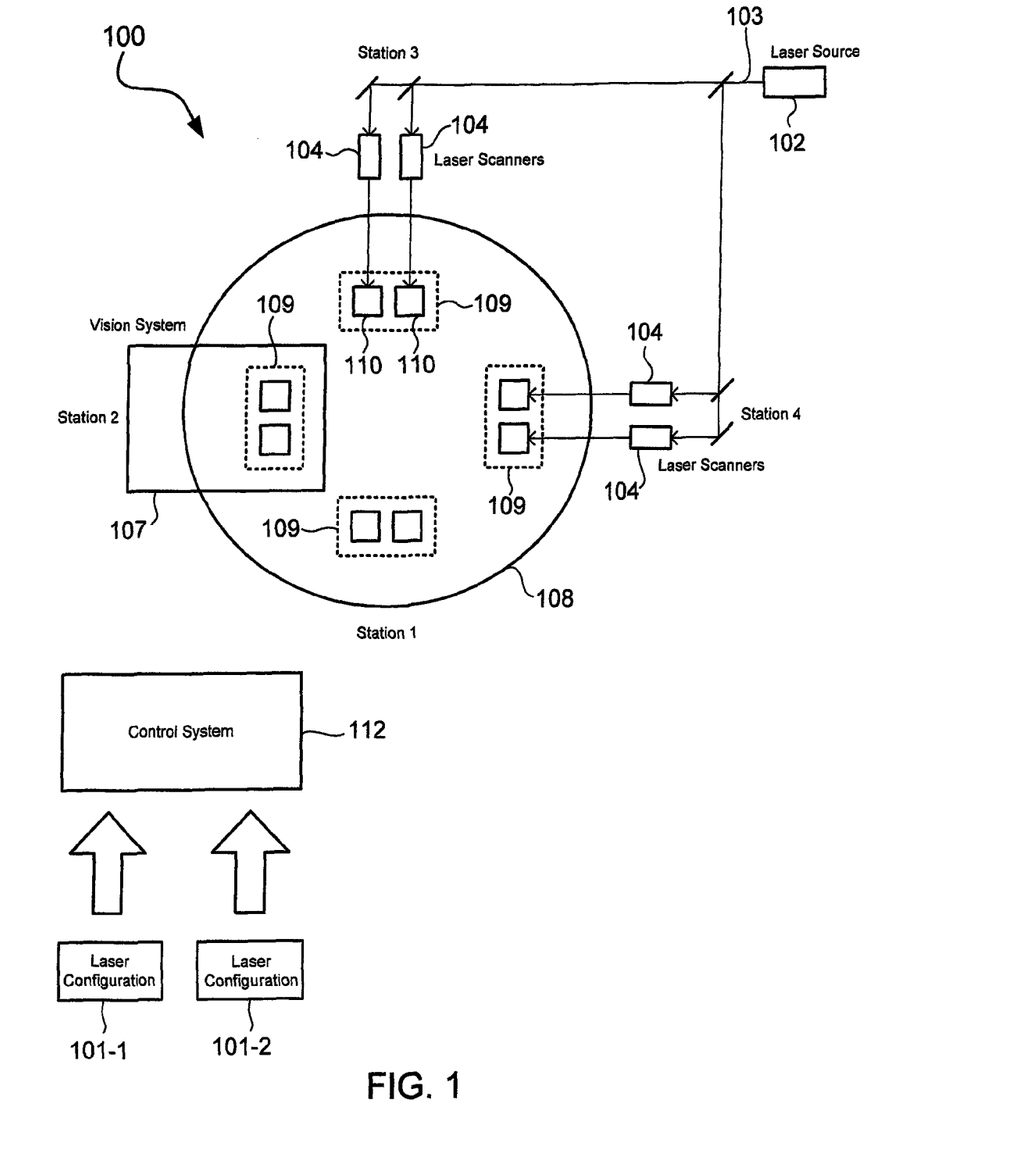
FIG. 1 is a plan view that schematically shows a solar cell ablation system in accordance with an embodiment of the present invention.

FIG. 1 is a plan view that schematically shows a solar cell ablation system 100 in accordance with an embodiment of the present invention. In the example of FIG. 1, the solar cell ablation system 100 includes a turntable 108, a vision system 107, a plurality of laser scanners 104, a single laser source 102, and a control system 112. The turntable 108 serves as a workpiece transport for moving solar cell wafers through the different stations of the ablation system 100. In some embodiments, different transport mechanisms are used for transporting workpieces between stations. As one non-limiting example, a linear conveyor can be used. In the example of FIG. 1, the ablation system 100 has four stations namely, stations 1 to 4. Accordingly, the turntable 108 includes four positions 109, each having one or more workpiece supports in the form of chucks 110. A chuck 110 is configured to hold and support a single solar cell wafer. Only some of the chucks 110 are labeled in FIG. 1 to avoid cluttering the figure. A chuck 110 secures the wafer to prevent it from moving while cycling through the stations.

Station 1 is a load/unload station, where wafers awaiting processing are loaded and processed wafers are unloaded. An automated workpiece handler, such as a pick and place robot, may be used to load and unload wafers to and from station 1. Wafers may also be manually loaded and unloaded to and from station 1.

Station 2 includes a workpiece position recognition system for determining the position of a wafer as secured on a chuck 110. In the example of FIG. 1, the workpiece position recognition system comprises the vision system 107. The vision system 107 may include a camera and associated processor and software for determining the position of a wafer in a position 109. The vision system 107 may compare the position of the wafer relative to a predetermined coordinate system to determine how much the wafer deviates, if any, from an expected position. The control system 112 may use this deviation information to make an adjustment to the movement of a corresponding laser scanner 104 in directing a laser beam on the wafer.

Stations 3 and 4 are wafer processing stations of the solar cell ablation system 100. In stations 3 and 4, one or more materials on each wafer are removed to form various solar cell structures, including contact holes. In the example of FIG. 1, a single laser source 102 generates a laser beam that is split into several laser beams, with each of the split laser beams being directed along a laser beam path by a corresponding laser scanner 104 to scan onto a wafer. The laser beam may be split using a beam splitter or other optical/mirror arrangement. The laser beams form contact holes by scribing through materials that have been formed on corresponding wafers. The laser source 102 may be a commercially available laser source, such as those available from SPI Lasers and Lumera Laser GmbH. In one embodiment, a laser scanner 104 comprises a galvanometer laser scanner, such as those commercially available from ScanLabs of Germany.

The control system 112 is electrically coupled to the laser source 102, the laser scanners 104, the vision system 107, and the drive of the turntable 108. The control system 112 controls the operation of the solar cell ablation system 100. More particularly, the control system controls the rotation of the turntable 108, the scanning movement of the laser scanners 104 to direct laser beams on wafers, and the laser source 102. In one embodiment, a laser scanner 104 is configured as a master with the rest of the laser scanners 104 being slaved to the master. The, control system 112 controls the scanning of the master laser scanner, with the rest of the laser scanners following the scanning of the master either exactly or in mirror image depending on the laser configuration.

In an example operation, the control system 112 drives the turntable 108 to move a wafer from station 1 to station 2. In station 2, the vision system 107 determines the position of the wafer as held in the position 109. The vision system 107 provides the position information to the control system 112, which uses the position information to control the movement of the corresponding laser scanner 104. The control system 112 then drives the turntable 108 to move the wafer from station 2 to station 3. There, a laser beam generated by the laser source 102 removes one or more materials from the wafer in accordance with a pattern and laser power level indicated in a laser configuration 101 that is currently loaded in and employed by the control system 112. The control system 112 thereafter drives the turntable 108 to move the wafer from station 3 to station 4. As in station 3, a laser beam generated by the laser source 102 removes one or more materials from the wafer in accordance with the pattern and laser power level indicated in the currently loaded laser configuration 101. The control system 112 drives the turntable 108 to move the processed wafer from station 4 to station 1, where the processed wafer is unloaded from the ablation system 100. As can be appreciated, the solar cell ablation system 100 may be configured to perform different processing steps on wafers being fabricated. That is, the solar cell ablation system 100 may also be used to direct a laser beam on the wafer to perform wafer processing steps other than ablation.

Figure 2:
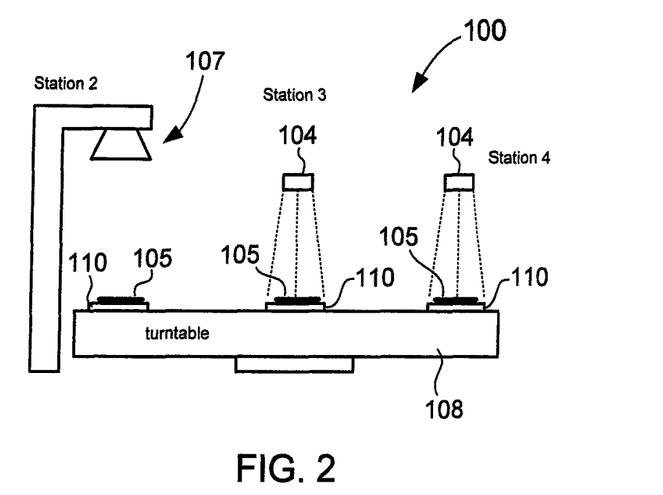
FIG. 2 is an elevation view of the solar cell ablation system of FIG. 1 in accordance with an embodiment of the present invention.

FIG. 2 is an elevation view of the solar cell ablation system 100 in accordance with an embodiment of the present invention. FIG. 2 shows the vision system 107 in station 2, a laser scanner 104 in station 3, and a laser scanner 104 in station 4. The station 1, which is in front of the station 3, is not shown. Note that there may be more than one laser scanner 104 in a processing station. The turntable 108 includes a chuck 110 to support a wafer 105 in each position.

A turntable approach is employed to avoid redundancy in wafer position recognition (e.g., station 2) or automation stations (e.g., station 1) and to ensure registration between station positions. Stations with low duty cycles are used for all wafers (e.g., load/unload, vision system, automated optical inspection), while only the pattern writing stations (e.g., stations 3 and 4) with high duty cycles are repeated in the system hardware. To maximize turntable usage, multiple wafers are processed in each station. The ratio of the number of vision/handling stations compared to the total number of processing stations required may be based on the duty cycles of the stations and physical constraints of the system, such as turntable size, wafer size, etc. As an example, if the turntable is limited to four stations, and the pattern to be scribed is in halves (bi-fold), the total number of vision/handling stations will be half the number of the processing stations. This way, the handling system will be simpler and cheaper, and the vision system will require less cameras. In general, the ablation system may be configured in different ways to maximize throughput while minimizing capital cost for a given cycle time and laser cost.

In the example of FIG. 1, the solar cell ablation system 100 has a so-called "4/2/1" design, where the first number indicates the number of rotary table operations or movements, the second number is the number of process stations, and the third number indicates the number of load/unload stations. In the solar cell ablation system 100 of FIG. 1, there are four rotary movements, two process stations (stations 3 and 4), and one load/unload station (station 1). Each position of the turntable may have one or more chucks. As can be appreciated, other designs are possible including 3/2/1, 4/3/1, 5/4/1 etc. depending on the application. The design of the ablation system is limited by the physical geometry of the system, the size of the turntable, and number of turns possible.

Alternate embodiments may include combinations of the non-processing stations, such as load/unload, in the same station as the wafer position recognition station, and accepting a slight processing station duty cycle reduction by loading at one station and unloading in another. The embodiment of FIG. 1 does not include an optical inspection station, but one may be added in another station. Optical inspection may also be incorporated off-line in another tool.

Non-quadrant based approaches may be considered to increase throughput, or to include an automated optical inspection. For example, a turntable that rotates 72 degrees may have 1 station for a vision system, 1 station for load/unload, and 3 process stations, with each of the process stations forming ⅓ of a pattern. As another example, a turntable that rotates 72 degrees may have 1 station for a vision system, 1 station for load/unload, 1 automated optical inspection station, and 2 process stations, with each of the process stations forming ½ of a pattern.

Figure 3:
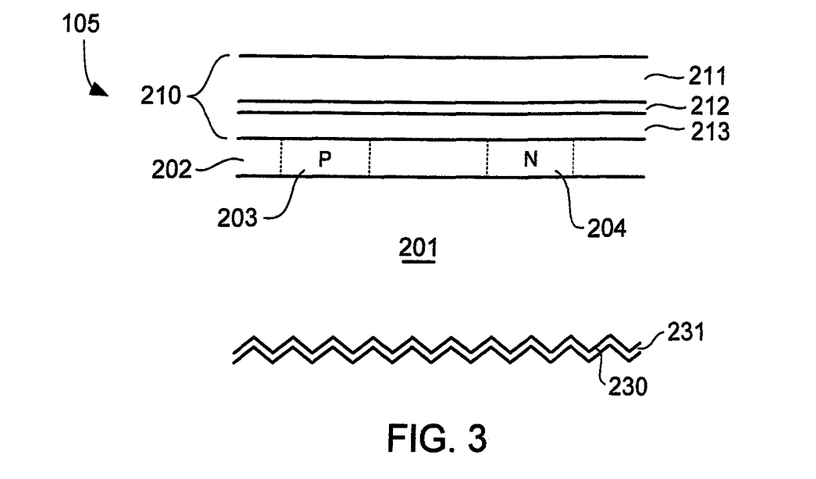
FIGS. 3-5 show cross sections of a wafer undergoing processing to fabricate solar cells in accordance with an embodiment of the present invention.
Figure 4:
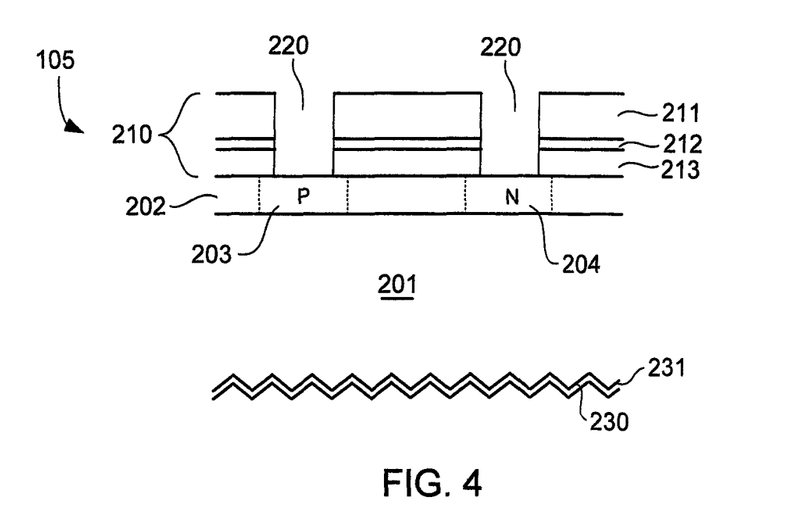
Figure 5:
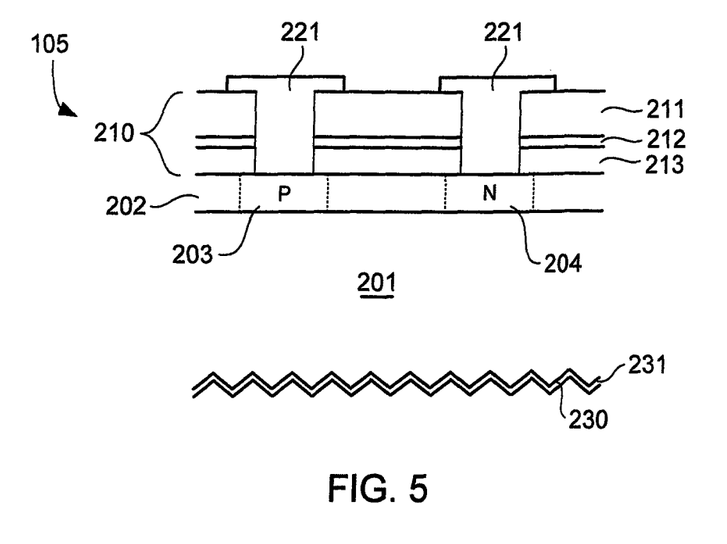

FIGS. 3-5 show cross sections of a wafer 105 undergoing processing to fabricate solar cells in accordance with an embodiment of the present invention. In the example of FIG. 3, the wafer 105 includes a solar cell substrate 201 comprising an N-type silicon wafer. A dielectric film stack 210 is formed on a layer 202, which comprises polysilicon in this example. The film stack 210 comprises multiple layers of materials, which in the example of FIG. 3 include a film 211, a film 212, and a film 213. As shown in FIG. 3, the film 211 may be formed on the film 212, which in turn is formed on the film 213. In one embodiment, the film 211 comprises a layer of silicon nitride formed to a thickness of 300 to 1000 angstroms, the film 212 comprises a layer of amorphous silicon formed to a thickness of 30 to 50 angstroms, and the film 213 comprises silicon dioxide formed to a thickness of about 120 angstroms. The film 212 may also comprise polysilicon or mc-silicon, depending on the application.

In one embodiment, the layer 202 comprises polysilicon formed to a thickness of about 2000 angstroms. A P-type diffusion region 203 and an N-type diffusion region 204 are formed in the layer 214. There are several diffusion regions in a solar cell but only one of each conductivity type is shown in FIG. 3 for clarity of illustration. The solar cell of FIGS. 3-5 is an example of a backside contact solar cell in that the diffusion regions 203 and 204, including metal contacts electrically coupled to them (see FIG. 5), are formed on the backside of the solar cell over the backside of the substrate 201. The front side of the wafer 105, which faces the sun to collect solar radiation during normal operation, is opposite the backside. In the example of FIG. 3, the front side surface of the substrate 201 is textured with random pyramids 230. An anti-reflective layer 231 comprising silicon nitride is formed on the textured surface on the front side.

The ablation system 100 of FIG. 1 is employed to ablate the silicon nitride film 211, the amorphous silicon film 212, and the oxide film 213 to form a hole through them and expose the diffusion regions 203 and 204. The ablation process is illustrated in FIG. 4, where the ablation step formed contact holes 220 exposing the diffusion regions 203 and 204. This allows for formation of metal contacts 221 to be formed in the contact holes 220, as illustrated in FIG. 5. The metal contacts 221 allow external electrical circuits to make electrical connection to the diffusion regions 203 and 204.

Figure 6A:
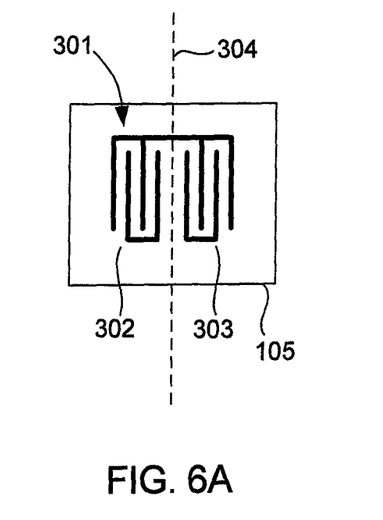
FIGS. 6A and 6B schematically show an example pattern to be scribed on a wafer in accordance with an embodiment of the present invention.
Figure 6B:
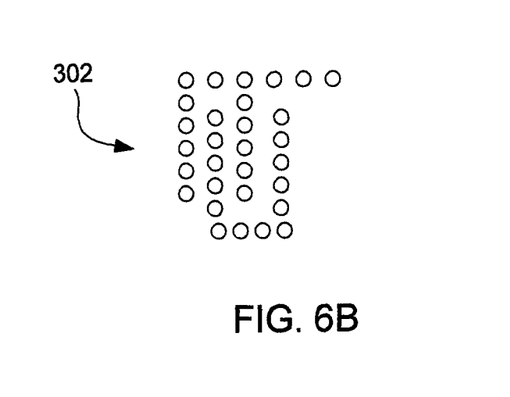

The contact holes 220 may be part of a pattern scribed on a wafer 105. FIG. 6A schematically shows an example pattern 301 to be scribed on a wafer 105 in accordance with an embodiment of the present invention. As can be appreciated, FIGS. 6A, 6B and the other drawings in this disclosure are not drawn to scale. The boundary around the pattern 301 schematically indicates that the pattern 301 is scribed on a wafer 105 using the solar cell ablation system 100.

In the example of FIG. 6A, the pattern 301 is symmetrical about a dashed line 304. The pattern 301 comprises a first half portion 302 and a second half portion 303. The pattern 301 is also referred to as "a bi-fold" pattern because the first half portion 302 is a mirror image of the second half portion 303. The pattern 301 represents a series of contact holes that are not necessarily contiguous or connected. This is exemplified in FIG. 6B where the first half portion 302 is depicted as a series of separate dots, with each dot representing a contact hole. A mirror image pattern, therefore, can be used to refer to such a pattern where the first and second halves are symmetrical about a central axis, including a horizontal or vertical axis.

A laser configuration 101-1 may indicate a pattern of the pattern 301, and the laser power level and pulse configuration for scribing the half portion on a wafer 105. The solar cell ablation system 100 may be configured to use the laser configuration 101-1 to scribe a first half portion 302 on one wafer and a second half portion 303 on another wafer at the same time using a single laser source 102. An example operation using this principle is now illustrated with reference to FIGS. 7 and 8.

Figure 7:
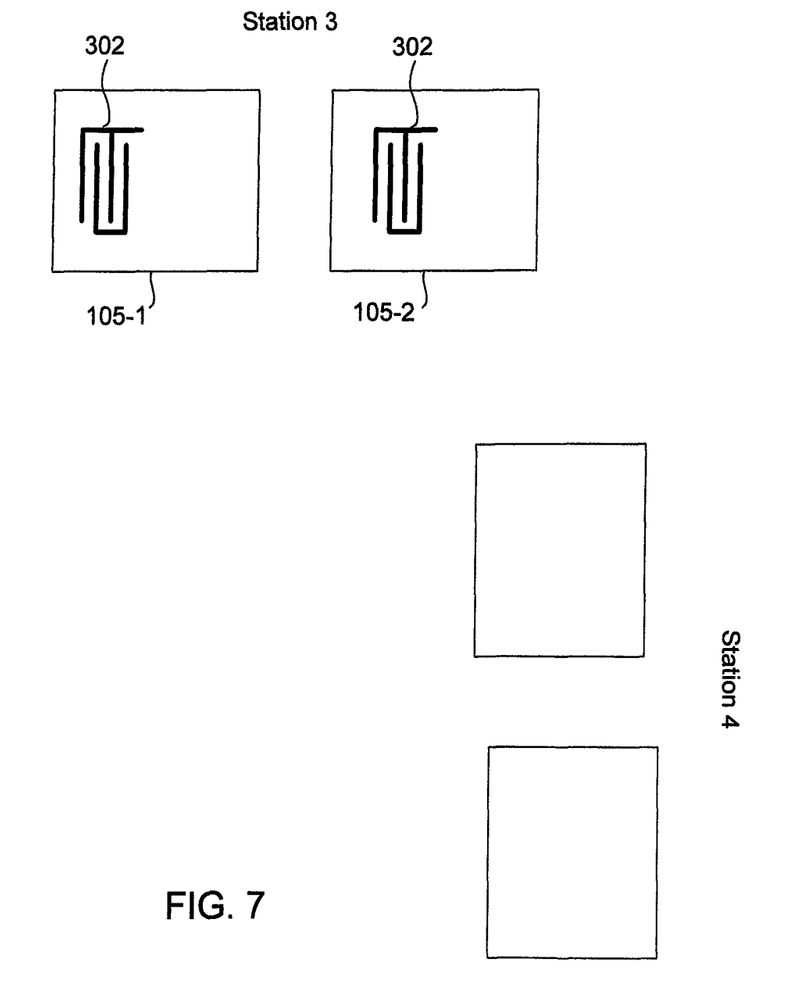
FIGS. 7 and 8 illustrate an example operation of a solar cell ablation system in accordance with an embodiment of the present invention.
Figure 8:
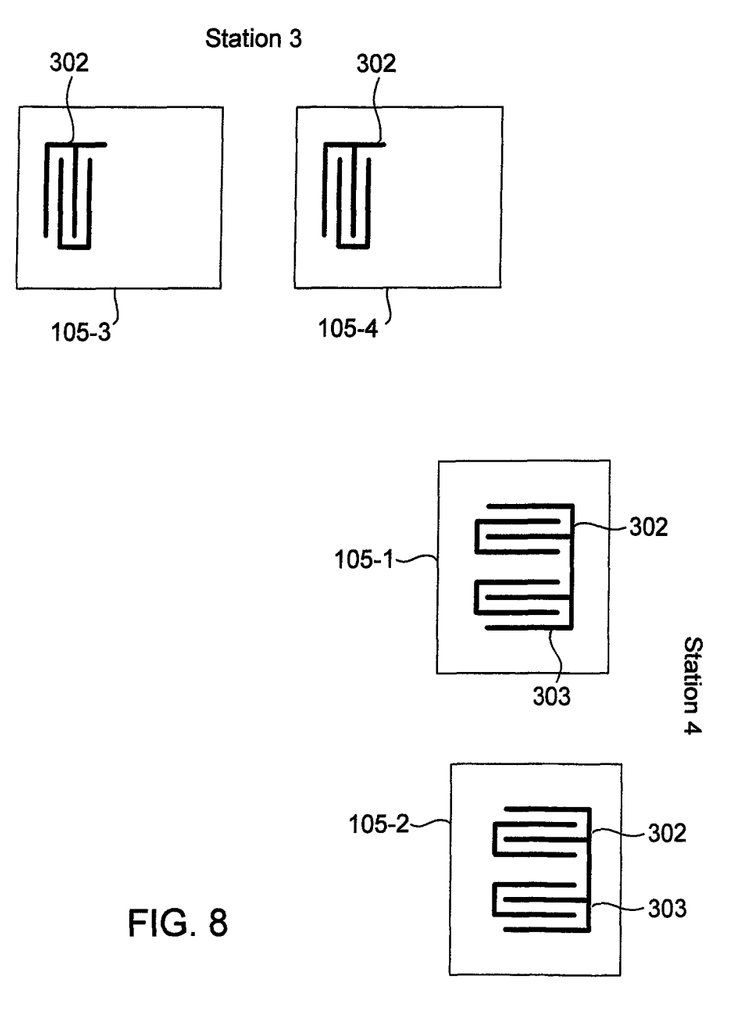

In FIG. 7, a first wafer 105-1 and a second wafer 105-2 are rotated from station 2 to station 3. There are no wafers in station 4 at this time. The single laser source 102 fires a laser beam on the laser scanners 104 in station 3, which the control system 112 directs to scribe the first half portion 302 on the wafers 105-1 and 105-2. Thereafter, as illustrated in FIG. 8, the control system 112 rotates the turntable 108 to move the wafers 105-1 and 105-2 into station 4, and a third wafer 105-3 and a fourth wafer 105-4 from station 2 to station 3. The single laser source 102 fires a laser beam, which is split into separate beams directed to the laser scanners 104 in both stations 3 and 4. The laser scanners 104 in both stations 3 and 4 may be slaved to a single master laser scanner 104, which may be any one of the laser scanners 104. The other laser scanners 104 are slaved to the master laser scanner. The laser scanners 104 in the station 4 may be configured to move a laser beam in mirror-image relative to the laser scanners 104 in the station 3. This advantageously allows the two half portions of the pattern 301 to be scribed at the same time on different stations using a single laser source 102. The first half of the pattern is scribed on a wafer in one station in one firing of the laser source 102, and the second half of the pattern is scribed on the same wafer in another station in a second firing of the laser source 102.

Still referring to FIG. 8, the scanners 104 in station 3 direct their laser beams to scribe the first half portion 302 on the wafers 105-3 and 105-4. At the same time, from the same firing of a laser beam from the laser source 102, the scanners 104 in station 4 direct their laser beams to scribe the second half portion 303 on the wafers 105-1 and 105-2, completing the pattern 301 on those wafers. The cycle may be repeated again, allowing for a completed pattern 301 to be scribed on a wafer 105 in two rotary movements of the turntable 108.

As can be appreciated from the foregoing, embodiments of the present invention provide advantages heretofore unrealized. First, the solar cell ablation system 100 allows for relatively high throughput, i.e., rate of wafer processing, without substantial increase in capital cost. Using a single laser source 102, the ablation system 100 splits patterning into separate steps performed in different stations in the same firing of the laser source 102. Given that patterning is the slowest part of the system cycle, splitting the pattern formation into several steps reduces the patterning time in a given processing station. For example, assuming forming a complete pattern on a wafer would take 14 seconds, the ablation system 100 is able to reduce this time to about 7 seconds (a 40% to 50% reduction in patterning time, taking into account overheads) by dividing the patterning into two steps in two different stations. In general, the ablation system 100 is advantageous when the duty cycle of a process is greater than 4 seconds and high precision is needed.

Second, the ablation system 100 provides substantial savings in capital expenditure. Given that the laser source is typically a large portion of the cost of a laser-based ablation system, using a single laser source 102 results in substantial savings. In general, the ablation system 100 reduces redundancy on alignment/calibration cameras, handlers, and lasers.

Third, the ablation system 100 allows for reduced system complexity. In the ablation system 100, the control system 112 controls a single laser source 102 and a single master laser scanner 104. The other laser scanners 104 are slaved to the master laser scanner 104. This allows the slaved laser scanners 104 in one station to simply follow the scanning of the master laser scanner 104, and the slaved laser scanners 104 in another station to scan in mirror-image of the master laser scanner 104. Mirror-image scanning may be achieved by mirror configuration in the corresponding laser scanner 104 or by taking a complement (or other operation) of the master laser scanner movement, rather than a completely different scanning movement.

In some applications, a pattern may require different laser power levels or may have a non-symmetrical design. For example, in interdigitated backside contact solar cells where the materials to the P-type and N-type diffusion regions are different, different laser power levels may be required depending on which pattern is being scribed. More specifically, a different laser power level may be needed to form contact holes to a P-type diffusion region as opposed to an N-type diffusion region. The difference in laser power levels may be due to different materials through which the contact holes are formed. In that case, a different laser configuration may be used for each power level or pattern being scribed on the wafer. Using the solar cell ablation system 100 of FIG. 1 as an example, one pattern may be scribed on the wafers in accordance with one laser configuration (e.g., configuration 101-1) in a first step and another pattern may be scribed on the wafers in a second step in accordance with another laser configuration (e.g., 101-2), etc. Each of the laser configurations may specify the pattern being scribed and the power level of the laser source scribing that pattern.

Figure 9A:
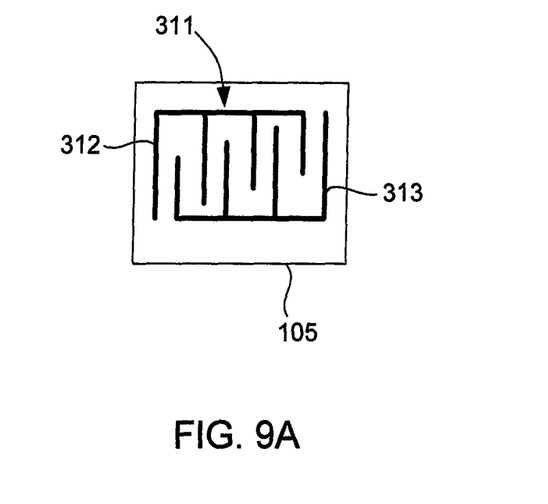
FIGS. 9A and 9B schematically show another example pattern to be scribed on a wafer in accordance with an embodiment of the present invention.

FIG. 9A schematically shows an example pattern 311 to be scribed on a wafer 105 in accordance with an embodiment of the present invention. FIG. 9A is not drawn to scale. The boundary around the pattern 311 schematically indicates that the pattern 311 is scribed on a wafer 105 using the solar cell ablation system 100.

Figure 9B:
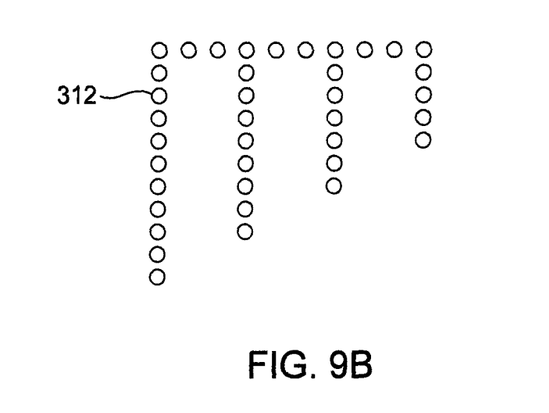

In the example of FIG. 9A, the pattern 311 comprises a first pattern 312 and a second pattern 313. The pattern 311 is an interdigitated pattern in that the pattern 312 is interdigitated with the pattern 313. The pattern 312 may comprise contact holes for a P-type diffusion region and the pattern 313 may comprise contact holes for an N-type diffusion region. The portions 312 and 313 may be scribed through different materials. Accordingly, in this example, the pattern 312 may be scribed on a wafer using a laser configuration 101-1 and the pattern 313 may be scribed on the wafer using a laser configuration 101-2. The pattern 311 represents a series of contact holes that are not necessarily contiguous or connected. This is exemplified in FIG. 9B where the pattern 312 is depicted as a series of separate dots, with each dot representing a contact hole.

In general, a first laser configuration may specify a first pattern and a first power level, a second laser configuration may specify a second pattern and a second power level, a third laser configuration may specify a third pattern and a third power level, and so on. As a particular example, the first pattern may be the pattern 312 scribed on a wafer at a first power level of the laser source 102, and the second pattern may be the pattern 313 scribed on a wafer at a second power level of the laser source 102.

The first pattern may be scribed on the wafers at the same time using the first power level on all processing stations in a first rotation of the turntable, the second pattern may be scribed on the wafers at the same time using the second power level different from the first power level on all processing stations in a second rotation of the turntable, and so on. By alternately using the patterns and corresponding power levels, a completed pattern is scribed in two rotary movements of the turntable.

Figure 10:
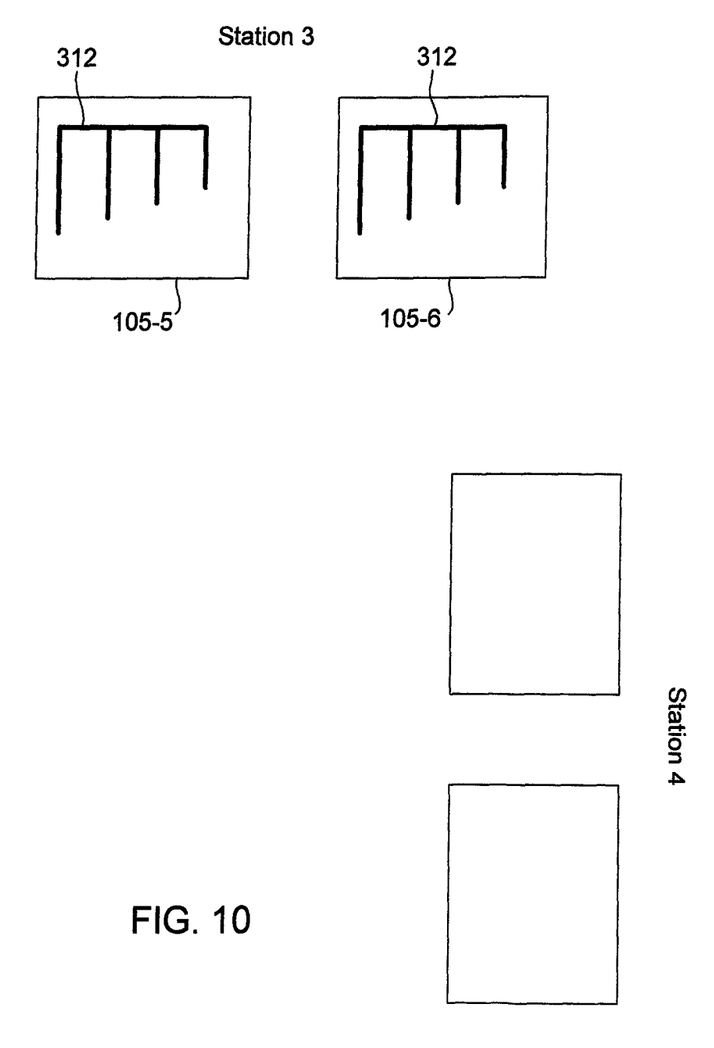
FIGS. 10-12 illustrate another example operation of a solar cell ablation system in accordance with an embodiment of the present invention.

An example operation for writing the pattern 311 on a wafer using the ablation system 100 is now explained with reference to FIGS. 10-12. In FIG. 10, the pattern 312 is scribed on the wafers 105-5 and 105-6 at the same time using a first power level of the laser source 102 in accordance with a laser configuration 101-1. There are no wafers in station 4 of this time.

Figure 11:
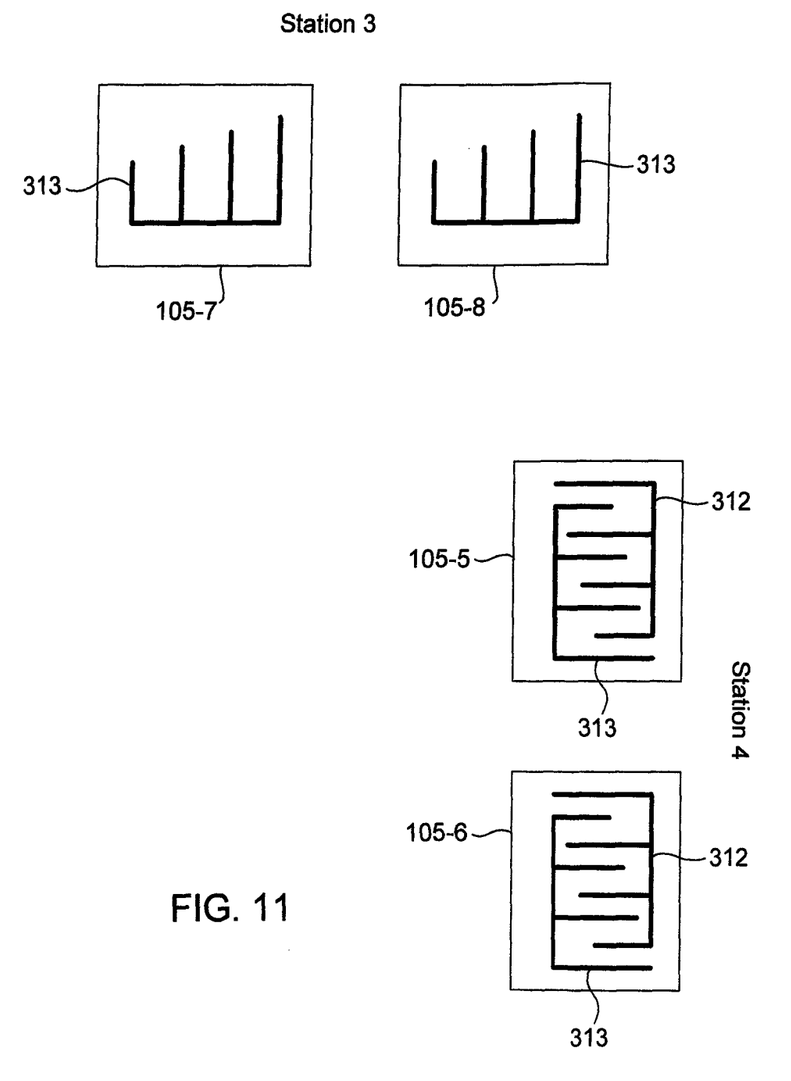

In FIG. 11, the turntable 108 is rotated to move wafers 105-7 and 105-8 into the station 3, and the wafers 105-5 and 105-6 from station 3 to station 4. The pattern 313 is scribed on the wafers 105-5, 105-6, 105-7, and 105-8 at the same time at a second power level of the laser source 102 in accordance with a laser configuration 101-2. Note that a complete pattern 311 comprising pattern patterns 312 and 313 is now scribed on the wafers 105-5 and 105-6 (see station 4).

Figure 12:
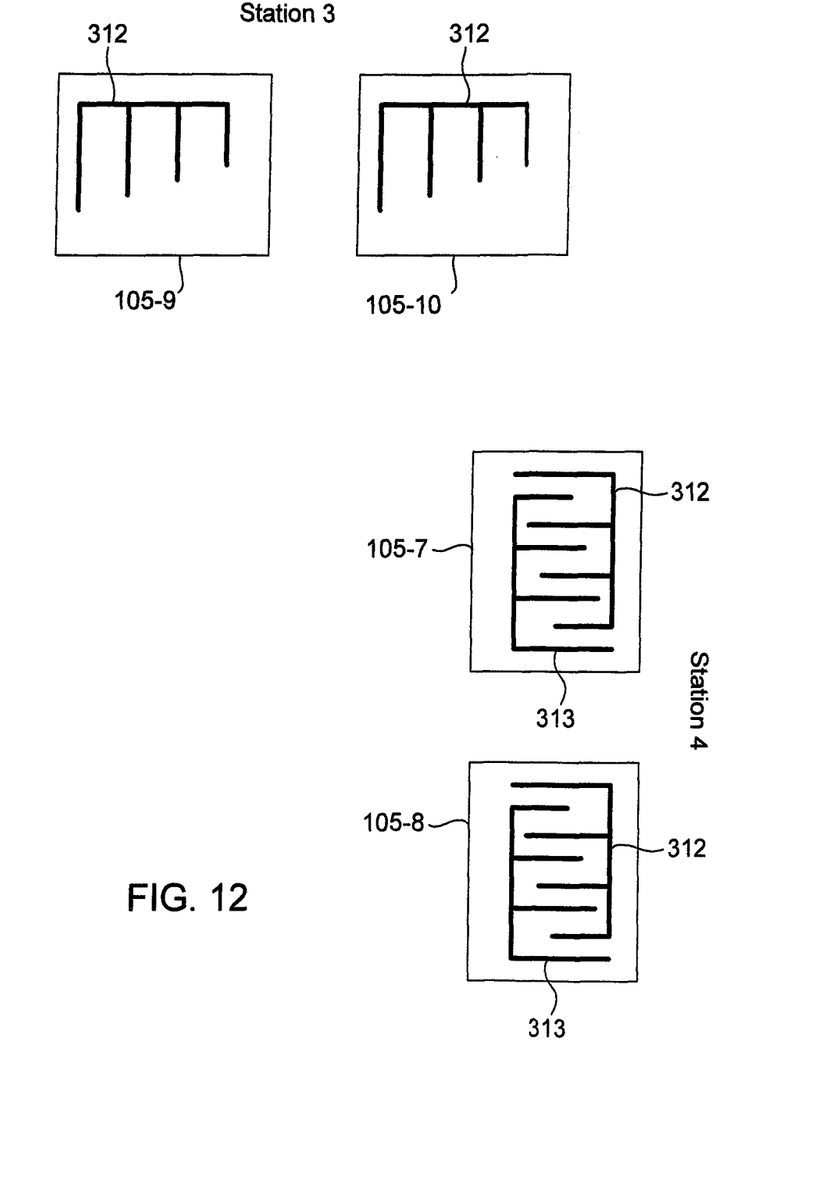

In FIG. 12, the turntable is rotated to move wafers 105-9 and 105-10 into the station 3, and the wafers 105-7 and 105-8 from station 3 to station 4. In the same rotary movement, the processed wafers 105-5 and 105-6 are moved from station 4 to station 1 (not shown), where the wafers 105-5 and 105-6 are unloaded. The pattern 312 is scribed on the wafers 105-7, 105-8, 105-9 and 105-10 at the same time at the first power level of the laser source 102 in accordance with the laser configuration 101-1. Note that the complete pattern 311 comprising patterns 312 and 313 is now scribed on the wafers 105-7 and 105-8 (see station 4). The cycle is repeated with the patterns 313 and 312 being alternately scribed on wafers present on the turntable 108.

In the example of FIGS. 10-12, one laser scanner 104 may be designated as the master laser scanner 104. All other laser scanners 104 are slaved to the master. That is, in any given station, only one laser scanner 104 needs to be directly controlled. The other laser scanners 104 may simply follow the master laser scanner 104. Because the patterning steps are independent of one another in this example, the pattern to be scribed on the wafer does not need to be symmetrical. As before, a single laser source 102 may be employed to scribe a complete pattern. This allows for the same benefits as previously explained constrained only by the overhead of switching between laser configurations.

As can be appreciated from the foregoing, embodiments of the present invention are not limited to applications involving removal of material from a wafer. For example, embodiments of the present invention are equally useful in applications where a laser beam is scanned on a wafer for annealing, diffusion, and other wafer processing steps.

A high throughput solar cell ablation system has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell ablation system comprising:
   a single laser source;
   a first laser scanner adapted to direct a first laser beam from the single laser source to scan on a first wafer in accordance with a first pattern in a first station;
   a transport adapted to move the first wafer from the first station to a second station; and
   a second laser scanner adapted to direct a second laser beam from the single laser source to scan on the first wafer in accordance with a second pattern in the second station.

2. The solar cell ablation system of claim 1 wherein the second pattern is a mirror image of the first pattern.

3. The solar cell ablation system of claim 1 wherein the transport comprises a turntable.

4. The solar cell ablation system of claim 1 further comprising:
   a beam splitter adapted to split a single laser beam from the single laser source into the first laser beam directed at the first station and another laser beam directed at the second station.

5. The solar cell ablation system of claim 4 wherein the first laser beam and the other laser beam are directed to the first and second stations at a same power level of the single laser source.

6. The solar cell ablation system of claim 1 wherein the second laser scanner is slaved to the first laser scanner.

7. The solar cell ablation system of claim 6 wherein the second laser scanner comprises a galvanometer laser scanner.

* * * * *